(12) United States Patent
Usami et al.

(10) Patent No.: US 8,517,082 B2
(45) Date of Patent: Aug. 27, 2013

(54) FINE PARTICLES AND METHOD FOR PRODUCING THE SAME

(75) Inventors: Yoshihisa Usami, Kanagawa (JP); Hideki Yasuda, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 615 days.

(21) Appl. No.: 12/699,915

(22) Filed: Feb. 4, 2010

(65) Prior Publication Data
US 2010/0196713 A1   Aug. 5, 2010

(30) Foreign Application Priority Data
Feb. 4, 2009   (JP) .................................. 2009-023613

(51) Int. Cl.
*B22D 23/00*   (2006.01)
(52) U.S. Cl.
USPC .......................................................... 164/46
(58) Field of Classification Search
USPC .......................................................... 164/46
See application file for complete search history.

(56) References Cited

U.S. PATENT DOCUMENTS

| | | | |
|---|---|---|---|
| 4,383,967 A | 5/1983 | Balz | |
| 2004/0178076 A1 | 9/2004 | Stonas et al. | |
| 2008/0142680 A1* | 6/2008 | Usa et al. | 249/160 |

FOREIGN PATENT DOCUMENTS

| | | |
|---|---|---|
| GB | 2 334 347 | 8/1999 |
| JP | 56-111804 | 9/1981 |
| JP | 6-028933 | * 2/1994 |
| JP | 06-028933 | 2/1994 |
| JP | 2001-330728 | 11/2001 |
| WO | 2007/094829 | 8/2007 |
| WO | WO 2007/105001 | 9/2007 |
| WO | 2009/014848 | 1/2009 |
| WO | 20111025522 | 3/2011 |

OTHER PUBLICATIONS

Japanese Office Action dated Feb. 5, 2013 in corresponding Japanese Patent Application No. 2009-023613 with partial English translation.
European Search Report—10000365.6—Apr. 29, 2013.

* cited by examiner

*Primary Examiner* — Kevin P Kerns
(74) *Attorney, Agent, or Firm* — Young & Thompson

(57) ABSTRACT

To provide a method for producing fine particles, including: forming on a surface of a base material a concavo-convex pattern made by arranging a plurality of convex portions on the surface; forming fine particles made of a fine particle material on at least part of the concavo-convex pattern; and releasing the formed fine particles from the concavo-convex pattern.

7 Claims, 6 Drawing Sheets

FINE PARTICLES AND METHOD FOR PRODUCING THE SAME

BACKGROUND OF THE INVENTION

1. Field of the Invention

The present invention relates to fine particles which are highly homogeneous and able to be widely used in a variety of fields, and a method for producing the fine particles.

2. Description of the Related Art

Conventionally, fine particles are produced by liquid-phase or gas-phase reaction, and intended shapes and compositions are obtained by controlling the reaction. However, the shapes and the compositions are limited according to the reaction utilized. Take Japanese Patent Application Laid-Open (JP-A) No. 2001-330728 for example, which proposes a method of forming a wire grid polarizer by oblique vapor deposition to a concavo-convex structure. The method of this proposal makes it possible to produce a wire grid polarizer from an inexpensive material through a relatively simple process.

However, in the method described in JP-A No. 2001-330728, it is possible to produce a polarizer in the form of a linear wire but not in the form of particles, so that the polarizer can hardly be obtained as particles.

Meanwhile, JP-A No. 06-28933 proposes a method of producing fine particles on a concavo-convex structure by heat treatment. The method of this proposal makes it possible to produce conductive fine particles with a desired diameter inexpensively and with little variation.

However, in the method described in JP-A No. 06-28933, isotropic deposition is carried out and an obtained film is divided into discrete pieces by heat, so that only spherical fine particles can be formed, and the fine particles can be formed on a substrate but can hardly be released.

Hence, in reality, a fine particle producing method capable of controlling the shape, fused state, etc. of fine particles and efficiently producing highly homogeneous fine particles has yet to be provided.

BRIEF SUMMARY OF THE INVENTION

An object of the present invention is to provide a method for producing highly homogeneous fine particles which have a uniform shape and do not vary much in dimension, and novel fine particles whose dimensions, shape, fused state and the like can be controlled.

As a result of carrying out a series of earnest examinations in an attempt to solve the above-mentioned problems, the present inventors have found that since the dimensions, shape and composition of fine particles can be directly controlled in a physical manner, it is possible to realize fine particles with dimensions, a shape and a composition which have been impossible to achieve owing to the limitation of the reaction, it is easily possible to produce highly homogeneous particles, fine particles composed of different components, fine particles with a laminated structure, etc., and the fine particles can be widely used in a variety of fields, for example as polarizer materials, birefringent materials and the like.

The present invention is based upon the findings of the present inventors, and means for solving the problems are as follows.

<1> A method for producing fine particles, including: forming on a surface of a base material a concavo-convex pattern made by arranging a plurality of convex portions on the surface; forming fine particles made of a fine particle material on at least part of the concavo-convex pattern; and releasing the formed fine particles from the concavo-convex pattern.

<2> The method according to <1>, wherein in the forming the concavo-convex pattern, an organic layer whose shape can change in heat mode is provided on the surface of the base material, and condensed light is applied to the organic layer so as to form the concavo-convex pattern.

<3> The method according to <1>, wherein in the forming the concavo-convex pattern, the concavo-convex pattern is formed by an imprinting method in which an imprint layer is provided on the surface of the base material, and an imprint mold is pressed against the imprint layer.

<4> The method according to <3>, wherein the imprint mold is formed by etching, using as a mask an organic layer provided with a concavo-convex pattern by applying condensed light to the organic layer whose shape can change in heat mode.

<5> The method according to any one of <1> to <4>, wherein the fine particles are formed by vacuum vapor deposition, and the vacuum vapor deposition is performed at an angle of 1° to 80° to the direction perpendicular to the base material, with the concavo-convex pattern side of the base material facing a direction of the vacuum vapor deposition.

<6> The method according to <5>, wherein at last two fine particle materials are used in the vacuum vapor deposition so as to form fine particles with a laminated structure.

<7> The method according to <5>, wherein at least two fine particle materials with different mixture proportions are used in the vacuum vapor deposition so as to form fine particles composed of different components with respect to a thickness direction.

<8> The method according to any one of <1> to <7>, wherein the fine particles are released by either removal of the concavo-convex pattern where the fine particles are formed or separation of the fine particles from the concavo-convex pattern.

<9> The method according to <8>, wherein either the removal of the concavo-convex pattern where the fine particles are formed or the separation of the fine particles from the concavo-convex pattern is performed by dissolving the concavo-convex pattern in a solvent.

<10> Fine Particles Obtained by the Method According to any One of <1> to <9>.

According to the present invention, it is possible to solve the problems in related art and provide a method for producing highly homogeneous fine particles which have a uniform shape and do not vary much in dimension, and novel fine particles whose dimensions, shape, fused state and the like can be controlled.

DETAILED DESCRIPTION OF THE INVENTION

Method for Producing Fine Particles, and Fine Particles

A method of the present invention for producing fine particles includes a concavo-convex pattern forming step, a fine particle forming step and a fine particle releasing step and, if necessary, includes other step(s).

Fine particles of the present invention are produced by this method of the present invention for producing fine particles.

The following explains the method of the present invention for producing fine particles and also clarifies details of the fine particles of the present invention.

<Concavo-Convex Pattern Forming Step>

The concavo-convex pattern forming step is a step of forming on a surface of a base material a concavo-convex pattern made by arranging a plurality of convex portions on the surface.

—Base Material—

The material, shape, structure, size and the like of the base material are not particularly limited and may be suitably selected according to the purpose. Examples of the material include metals, inorganic substances and organic substances. Examples of the shape include a flat-plate shape. Examples of the structure include a single-layer structure and a laminated structure. The size may be suitably selected according to the intended use, etc.

The metals are preferably transition metals. Examples of the transition metals include metals such as Ni, Cu, Al, Mo, Co, Cr, Ta, Pd, Pt and Au, and alloys thereof.

Examples of the inorganic substances include glass, silicon (Si) and quartz ($SiO_2$).

Examples of the organic substances include polyethylene terephthalate (PET), polyethylene naphthalate (PEN), polycarbonate (PC), low-melting-point fluorine resins, polymethyl methacrylate (PMMA) and triacetate cellulose (TAC). Among these, PET, PC and TAC are particularly preferable.

—Formation of Concavo-Convex Pattern—

The concavo-convex pattern may be an originally formed concavo-convex pattern, for example on a base material made of silicate earth; nevertheless, it is preferable to form a concavo-convex pattern in an intended manner by photolithography, imprinting or the like and thereby to adjust the final fine particle shape. The concavo-convex pattern is preferably able to be removed after fine particles have been formed. Accordingly, the shape of the concavo-convex pattern needs to remain as it is to some extent at the time of particle formation, and the concavo-convex pattern is preferably able to be removed by means of solvent or the like.

Figure 2A:
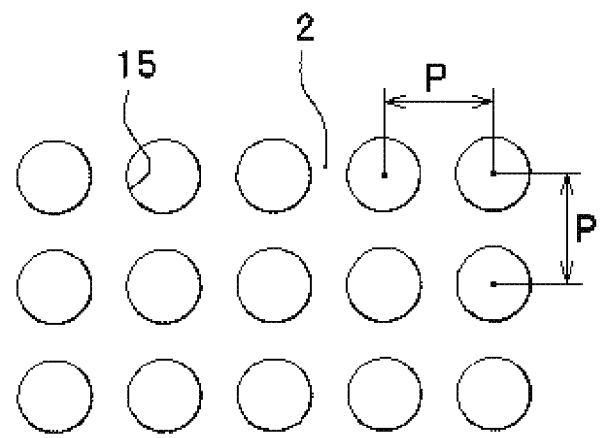
FIG. 2A is a drawing showing an example of a surface of an organic layer as seen in a planar view.
Figure 2B:
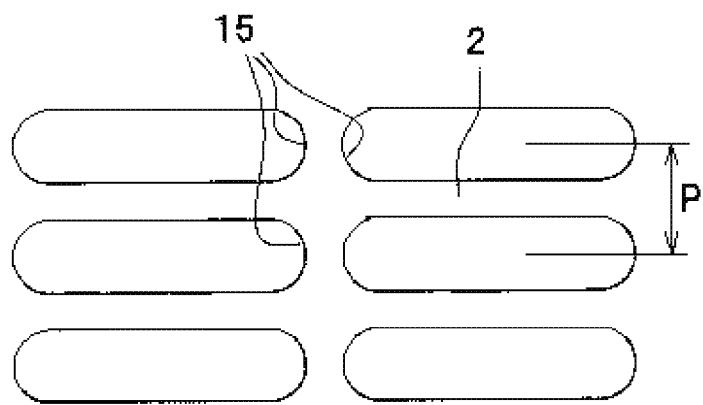
FIG. 2B is a drawing showing another example of a surface of an organic layer as seen in a planar view.
Figure 2C:
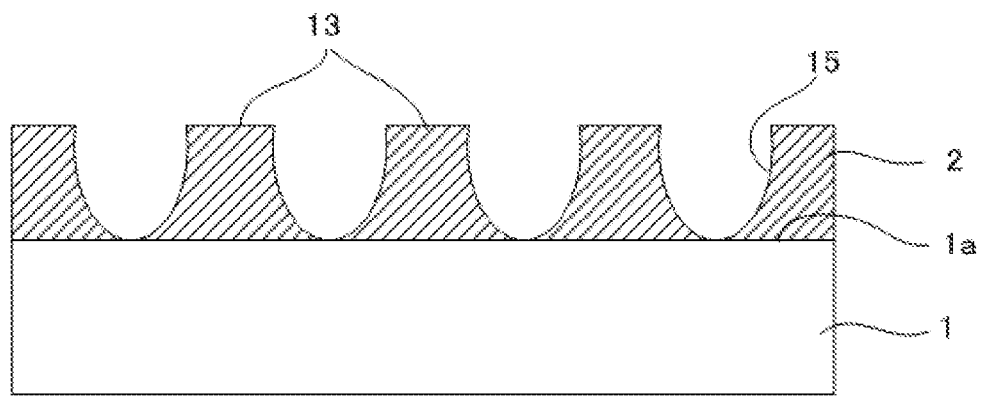
FIG. 2C is a cross-sectional view showing an example of an organic layer with concave portions formed therein, and a base material.

Here, as shown in FIG. 2C, a plurality of convex portions 13 and concave portions 15 are formed at a constant pitch over a surface 1a of a base material 1. In this case, the convex portions 13, and the concave portions 15 formed between the convex portions 13 may together be referred to as "concavo-convex pattern".

The concavo-convex pattern is not necessarily linear in cross-sectional shape but may be curved in cross-sectional shape.

As to the formation of the concavo-convex pattern, the concavo-convex pattern may be formed in the base material by subjecting the base material itself to sand blast processing; nevertheless, it is preferable to employ a method of providing, on the base material, a layer (an organic layer or an imprint layer) at which the concavo-convex pattern can be formed, and removing the concavo-convex pattern when fine particles are released. Specific examples of the method include (1) a method of providing, on a surface of a base material, an organic layer whose shape can change in heat mode, and applying condensed light to the organic layer so as to form a concavo-convex pattern at the organic layer; and (2) a method of forming a concavo-convex pattern by imprinting in which an imprint layer is provided on a surface of a base material and an imprint mold is pressed against the imprint layer so as to form a concavo-convex pattern at the imprint layer.

—Concavo-Convex Pattern Forming Method According to (1)—

The organic layer whose shape can change in heat mode is a layer that can change in shape and enables concave portions to be formed in the layer by means of heat to which light has been converted in strong light irradiation. As the material for the organic layer, a cyanine-based compound, a phthalocyanine-based compound, a quinone-based compound, a squarylium-based compound, an azulenium-based compound, a thiol complex salt-based compound, a merocyanine-based compound or the like may be used, for example.

Preferred examples thereof include methine pigments (cyanine pigments, hemicyanine pigments, styryl pigments, oxonol pigments, merocyanine pigments, etc.), macrocyclic pigments (phthalocyanine pigments, naphthalocyanine pigments, porphyrin pigments, etc.), azo pigments (including azo metal chelate pigments), allylidene pigments, complex pigments, coumarin pigments, azole derivatives, triazine derivatives, 1-aminobutadiene derivatives, cinnamic acid derivatives and quinophthalone-based pigments. Among these, methine pigments and azo pigments are particularly preferable.

Regarding the organic layer, a pigment used therefor may be suitably selected according to the wavelength of a laser light source, and the structure thereof may be modified.

For example, when the oscillation wavelength of the laser light source is in the vicinity of 780 nm, selection of a pigment from pentamethine cyanine pigment, heptamethine oxonol pigment, pentamethine oxonol pigment, phthalocyanine pigment, naphthalocyanine pigment and the like is advantageous.

When the oscillation wavelength of the laser light source is in the vicinity of 660 nm, selection of a pigment from trimethine cyanine pigment, pentamethine oxonol pigment, azo pigment, azo metal complex pigment, pyrromethene complex pigment and the like is advantageous.

When the oscillation wavelength of the laser light source is in the vicinity of 405 nm, selection of a pigment from monomethine cyanine pigment, monomethine oxonol pigment, zeromethine merocyanine pigment, phthalocyanine pigment, azo pigment, azo metal complex pigment, porphyrin pigment, allylidene pigment, complex pigment, coumarin pigment, azole derivative, triazine derivative, benzotriazole derivative, 1-aminobutadiene derivative, quinophthalone-based pigment and the like is advantageous.

Preferred examples of compounds suitable for the organic layer, when the oscillation wavelength of the laser light source is in the vicinity of 405 nm, will be mentioned below. The compounds represented by Structural Formulae III-1 to III-14 below are preferred examples when the oscillation wavelength of the laser light source is in the vicinity of 405 nm. Meanwhile, preferred examples of compounds suitable for the organic layer, when the oscillation wavelength of the laser light source is in the vicinity of 780 nm or 660 nm, include the compounds mentioned in the paragraphs [0024] to [0028] of JP-A No. 2008-252056. In the present invention, use of any of these compounds is not compulsory.

<Examples of Compounds when Oscillation Wavelength of Laser Light Source is in the Vicinity of 405 nm>

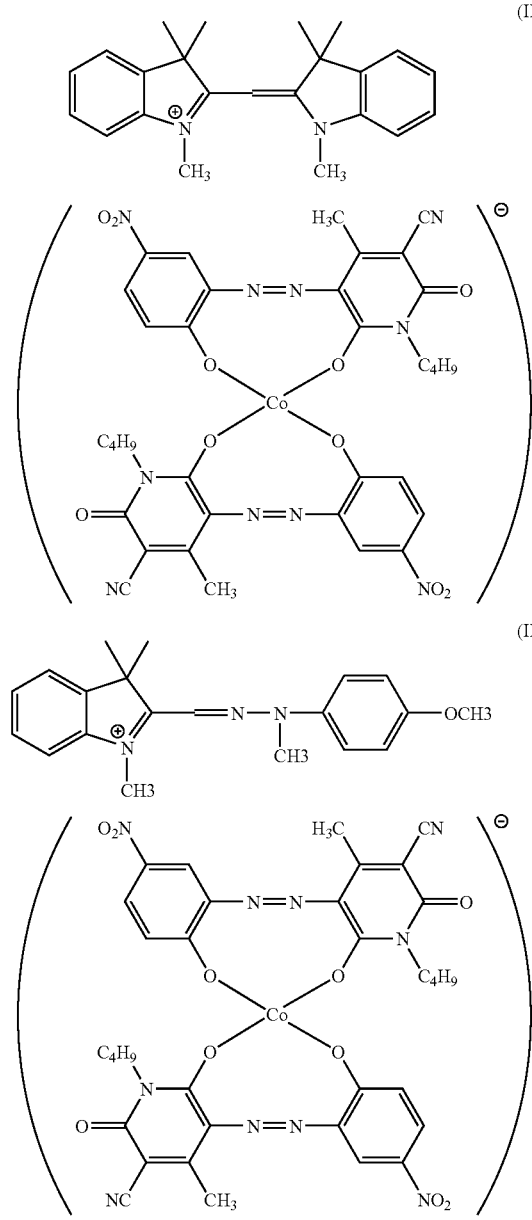

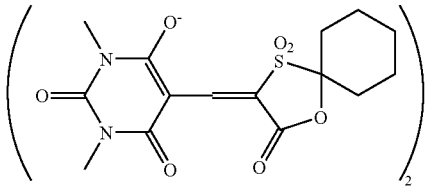

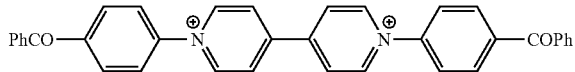

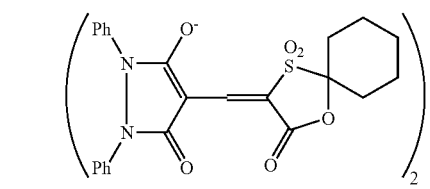

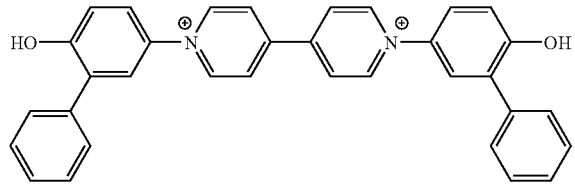

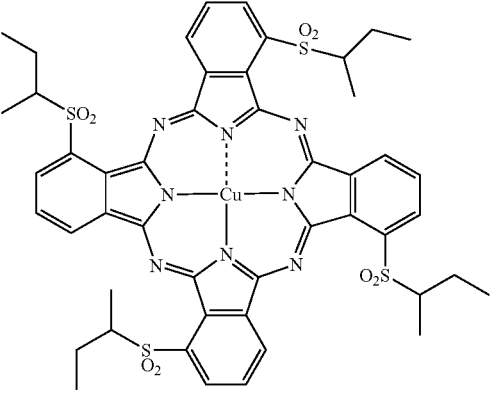

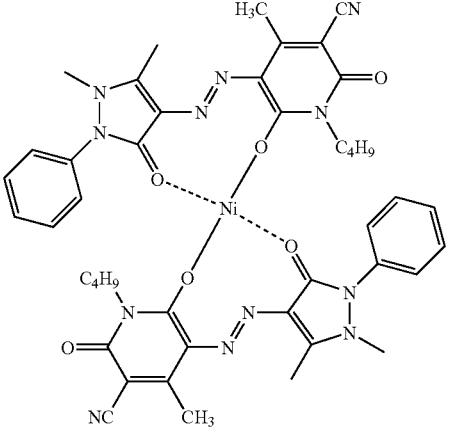

<Examples of Compounds when Oscillation Wavelength of Laser Light Source is in the Vicinity of 405 nm>

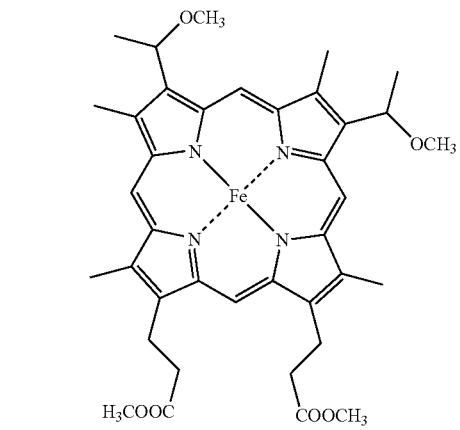
(III-7)

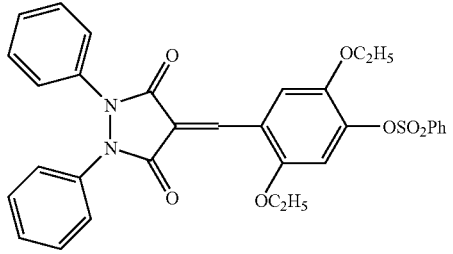
(III-8)

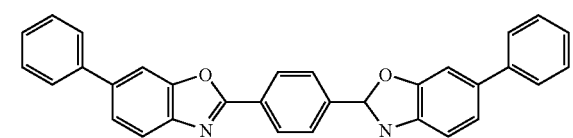
(III-9)

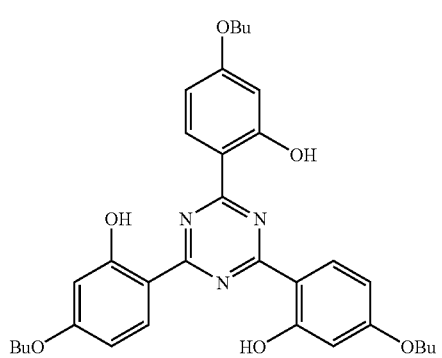
(III-10)

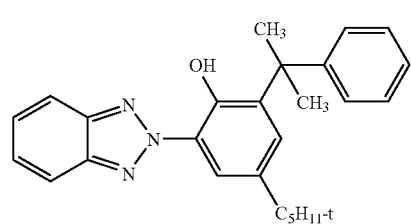
(III-11)

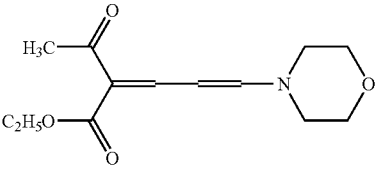
(III-12)

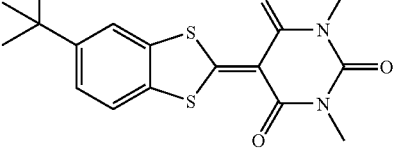
(III-13)

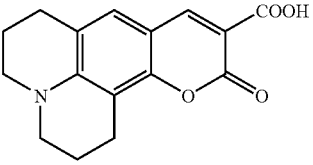
(III-14)

Also, the pigments mentioned in JP-A Nos. 04-74690, 08-127174, 11-53758, 11-334204, 11-334205, 11-334206, 11-334207, 2000-43423, 2000-108513 and 2000-158818, etc. can be suitably used.

A coating solution for such a pigment-containing organic layer is prepared by dissolving a pigment in a solvent along with a bonding agent, etc. The organic layer can be formed by applying this coating solution onto the base material so as to form a coating film and then drying it. At that time, the temperature of the surface of the base material onto which the coating solution is applied is preferably in the range of 10° C. to 40° C. The lower limit value of the temperature is preferably 15° C. or higher, more preferably 20° C. or higher, particularly preferably 23° C. or higher. The upper limit value of the temperature is preferably 35° C. or lower, more preferably 30° C. or lower, particularly preferably 27° C. or lower. When the temperature of the surface is in the above-mentioned range, it is possible to prevent the occurrence of uneven application of the coating solution or application trouble and make the coating film have a uniform thickness. Note that the upper limit value and the lower limit value may be arbitrarily and independently set.

Here, the organic layer may have a single-layer structure or a multilayer structure; in the case where it has a multilayer structure, it is formed by carrying out a coating process a plurality of times.

As for the concentration of the pigment in the coating solution, it is desirable that the pigment be dissolved in the solvent so as to occupy 0.3% by mass to 30% by mass, more desirably 1% by mass to 20% by mass, of the solvent. It is particularly desirable that the pigment be dissolved in 2,2,3,3-tetrafluoro-1-propanol so as to occupy 1% by mass to 20% by mass of the 2,2,3,3-tetrafluoro-1-propanol.

The solvent of the coating solution is not particularly limited and may be suitably selected according to the purpose. Examples thereof include esters such as butyl acetate, ethyl lactate and cellosolve acetate; ketones such as methyl ethyl ketone, cyclohexanone and methyl isobutyl ketone; chlorinated hydrocarbons such as dichloromethane, 1,2-dichloroethane and chloroform; amides such as dimethylformamide; hydrocarbons such as methyl cyclohexane; ethers such as tetrahydrofuran, ethyl ether and dioxane; alcohols such as ethanol, n-propanol, isopropanol and n-butanol diacetone alcohol; fluorine-based solvents such as 2,2,3,3-tetrafluoro-1-propanol; and glycol ethers such as ethylene glycol monomethyl ether, ethylene glycol monoethyl ether and propylene glycol monomethyl ether. Among these, butyl acetate, ethyl lactate, cellosolve acetate, methyl ethyl ketone, isopropanol and 2,2,3,3-tetrafluoro-1-propanol are particularly preferable.

These solvents may be used individually or in combination in view of the solubility of the pigment used. Further, additive(s) such as an antioxidant, an UV absorber, a plasticizer, a lubricant, etc. may be added into the coating solution according to the purpose.

The method for the application of the coating solution is not particularly limited and may be suitably selected according to the purpose. Examples thereof include spraying, spin coating, dipping, roll coating, blade coating, doctor roll method, doctor blade method and screen printing. Among these, employment of spin coating is preferable in terms of productivity and facilitation of control of the film thickness.

It is desirable that the pigment be dissolved in the solvent so as to occupy 0.3% by mass to 30% by mass, more desirably 1% by mass to 20% by mass, of the solvent because, if so, the organic layer can be advantageously formed by spin coating.

The pyrolysis temperature of the pigment is preferably 150° C. to 500° C., more preferably 200° C. to 400° C.

The temperature of the coating solution when applied is preferably 23° C. to 50° C., more preferably 24° C. to 40° C., even more preferably 25° C. to 30° C.

In the case where the coating solution contains a bonding agent, the bonding agent is not particularly limited and may be suitably selected according to the purpose. Examples thereof include natural organic polymeric substances such as gelatin, cellulose derivatives, dextran, rosin and rubber; hydrocarbon-based resins such as polyethylene, polypropylene, polystyrene and polyisobutylene; vinyl-based resins such as polyvinyl chloride, polyvinylidene chloride and polyvinyl chloride-polyvinyl acetate copolymer; acrylic resins such as polymethyl acrylate and polymethyl methacrylate; synthetic organic polymers, for example initial condensates of thermosetting resins such as polyvinyl alcohol, chlorinated polyethylene, epoxy resins, butyral reins, rubber derivatives and phenol-formaldehyde resins.

As for the amount of the bonding agent when used as a material for the organic layer, it is generally desirable that the mass of the bonding agent be 0.01 times to 50 times the mass of the pigment, and more desirable that the mass of the bonding agent be 0.1 times to 5 times the mass of the pigment.

A discoloration preventing agent selected from a variety of discoloration preventing agents may be contained in the organic layer to improve the light resistance of the organic layer.

As the discoloration preventing agent, a singlet oxygen quencher is generally used. The singlet oxygen quencher may be selected from quenchers mentioned in already known publications such as patent specifications.

Specific examples thereof include those mentioned in JP-A Nos. 58-175693, 59-81194, 60-18387, 60-19586, 60-19587, 60-35054, 60-36190, 60-36191, 60-44554, 60-44555, 60-44389, 60-44390, 60-54892, 60-47069, 63-209995 and 04-25492, Japanese Patent Application Publication (JP-B) Nos. 01-38680 and 06-26028, German Patent No. 350399, and p. 1141 of the October, 1992 issue of Journal of the Chemical Society of Japan.

The amount of the discoloration preventing agent such as a singlet oxygen quencher is preferably 0.1% by mass to 50% by mass, more preferably 0.5% by mass to 45% by mass, even more preferably 3% by mass to 40% by mass, particularly preferably 5% by mass to 25% by mass, with respect to the amount of the pigment.

Although the foregoing has described a solvent applying method for formation of the organic layer, it should be noted that the organic layer can also be formed by a deposition method such as vapor deposition, sputtering or CVD.

A pigment which is higher in absorptance at the wavelength of laser light used in the after-mentioned formation of concave portions than at any other wavelength is used as the pigment.

The absorption peak wavelength of the pigment is not necessarily in the wavelength region of visible light but may be in the ultraviolet or infrared wavelength region.

The wavelength $\lambda w$ of laser light for forming concave portions, and the absorption peak wavelength $\lambda a$ of the pigment preferably satisfy the relationship $\lambda a < \lambda w$. If this relationship is satisfied, the amount of light absorbed by the pigment is appropriate, thereby enhancing recording efficiency, and an exquisite concavo-convex shape may be able to be formed. Also, the relationship $\lambda w < \lambda c$ is preferably satisfied. This is because $\lambda w$ should be the wavelength at which the pigment absorbs light, so that when the central wavelength $\lambda c$ of light emitted by a light emitting device is longer than the wavelength $\lambda w$, the light emitted by the light emitting device is not absorbed into the pigment and thus there is an increase in transmittance, thereby improving luminous efficacy.

From the foregoing viewpoint, the relationship $\lambda a < \lambda w < \lambda c$ will be most desirable.

The wavelength $\lambda w$ of the laser light for forming the concave portions should be such a wavelength as makes it possible to obtain great laser power; for example, in the case where a pigment is used in the organic layer, the wavelength $\lambda w$ is preferably 1,000 nm or less, e.g. 193 nm, 210 nm, 266 nm, 365 nm, 405 nm, 488 nm, 532 nm, 633 nm, 650 nm, 680 nm, 780 nm or 830 nm.

As for the type of the laser light, the laser light may be any of a gas laser, a solid-state laser, a semiconductor laser and the like. It should, however, be noted that employment of a solid-state laser or a semiconductor laser is preferable in view of simplification of an optical system. The laser light may be continuous light or pulsed light, and it is preferable to employ laser light with freely alterable luminous intervals. For example, it is preferable to employ a semiconductor laser. In the case where the laser cannot be directly subjected to on-off modulation, it is preferable to modulate the laser using an external modulation device.

The laser power is preferably high in view of increasing the processing speed. It should, however, be noted that as the laser power is increased, the scanning speed (speed at which the organic layer is scanned with the laser light) has to be increased as well. Therefore, in view of the upper limit value of the scanning speed, the upper limit value of the laser power is preferably 100 W, more preferably 10 W, even more preferably 5 W, particularly preferably 1 W. The lower limit value of the laser power is preferably 0.1 mW, more preferably 0.5 mW, even more preferably 1 mW.

Further, it is desirable that the laser light be superior in oscillation wavelength width and coherency and can be focused to a spot size equivalent to its wavelength. As for light pulse irradiation conditions for appropriately forming the concave portions, it is desirable to employ such a strategy as used for optical disks. Specifically, it is desirable to employ such conditions in relation to the recording speed and the crest value and pulse width of applied laser light as used for optical disks.

It is desirable that the thickness of the organic layer correspond to the depth of the after-mentioned concave portions 15.

The thickness of the organic layer can, for example, be set in the range of 1 nm to 10,000 nm. The lower limit value of the thickness is preferably 10 nm or greater, more preferably 30 nm or greater. When the organic layer is too thin, concave portions 15 which are shallow are formed, so that optical effects may not be obtained. The upper limit value of the thickness is preferably 1,000 nm or less, more preferably 500 nm or less. When the organic layer is too thick, great laser power is required, formation of deep holes may be difficult, and further, the processing speed may decrease.

Also, the thickness t of the organic layer and the diameter d of a concave portion preferably satisfy the following relationship.

Regarding the upper limit value of the thickness t of the organic layer, the relationship $t<10\,d$ is preferably satisfied, more preferably $t<5\,d$, even more preferably $t<3\,d$. Regarding the lower limit value of the thickness t of the organic layer, the relationship $t>d/100$ is preferably satisfied, more preferably $t>d/10$, even more preferably $t>d/5$. The reasons why the upper and lower limit values of the thickness t of the organic layer are set in relation to the diameter d of the concave portion are similar to the above-mentioned reasons.

At the time of formation of the organic layer, the organic layer can be formed by dissolving or dispersing a pigment in a certain solvent so as to prepare a coating solution, and then applying this coating solution onto the surface of the base material by a coating method such as spin coating, dip coating or extrusion coating.

A plurality of concave portions are periodically formed in the organic layer. These concave portions are formed by irradiating the organic layer with condensed light so as to deform the irradiated portions (which includes deformation by loss).

The principle of the formation of the concave portions is as follows.

When the organic layer is irradiated with laser light having a wavelength at which a material absorbs light (laser light having such a wavelength as to be absorbed by the material), the laser light is absorbed by the organic layer, this absorbed light is converted to heat, and the irradiated portions increase in temperature. Thus, the organic layer undergoes chemical and/or physical change(s) such as softening, liquefaction, vaporization, sublimation, decomposition, etc. As the material having undergone such change(s) moves and/or disappears, concave portions are formed.

For the formation of the concave portions, a pit forming method known in relation to write-once optical disks, recordable optical disks, etc. may be used, for example. Specifically, a known technique for running OPC may, for example, be used which involves detecting the intensity of reflected laser light, which changes according to the pit size, correcting the output of the laser light such that the intensity of the reflected laser light becomes constant, and thusly forming uniform pits (refer to Japanese Patent No. 3096239).

The above-mentioned vaporization, sublimation or decomposition of the organic layer preferably takes place at a great change rate and precipitously. Specifically, the mass reduction rate at the time of the vaporization, sublimation or decomposition of the pigment, measured using a differential thermal balance (TG-DTA), is preferably 5% or greater, more preferably 10% or greater, even more preferably 20% or greater. Also, the slope of the mass reduction (i.e. the mass reduction rate with respect to an increase in temperature by 1° C.) at the time of the vaporization, sublimation or decomposition of the pigment, measured using a differential thermal balance (TG-DTA), is preferably 0.1%/° C. or greater, more preferably 0.2%/° C. or greater, even more preferably 0.4%/° C. or greater.

The upper limit value of the transition temperature in relation to the chemical and/or physical change(s) such as softening, liquefaction, vaporization, sublimation, decomposition, etc. is preferably 2,000° C. or lower, more preferably 1,000° C. or lower, even more preferably 500° C. or lower. When the transition temperature is too high, great laser power may be required. The lower limit value of the transition temperature is preferably 50° C. or higher, more preferably 100° C. or higher, even more preferably 150° C. or higher. When the transition temperature is too low, the temperature gradient between the target portions and surrounding portions is low, so that the shape of hole edges may not be clear.

FIG. 2A is a drawing showing an example of an organic layer as seen in a planar view, FIG. 2B is a drawing showing another example of an organic layer as seen in a planar view, and FIG. 2C is a cross-sectional view showing a base material and an organic layer. As shown in FIG. 2A, concave portions 15 formed in the shape of dots which are arranged in the form of a lattice may be employed. Meanwhile, as shown in FIG. 2B, concave portions 15 may be formed as long thin grooves which extend with spaces in between. Further, although not shown, concave portions 15 may be formed as continuous grooves.

The pitch P of the concave portions 15 is 0.01 times to 100 times the central wavelength $\lambda c$ of light emitted by an LED device 10 as a luminous member.

The pitch P of the concave portions 15 is preferably 0.05 times to 20 times, more preferably 0.1 times to 5 times, even more preferably 0.5 times to 2 times, the central wavelength $\lambda c$. Specifically, the lower limit value of the pitch P is preferably 0.01 times or greater, more preferably 0.05 times or greater, even more preferably 0.1 times or greater, particularly preferably 0.2 times or greater, the central wavelength $\lambda c$. The upper limit value of the pitch P is preferably 100 times or less, more preferably 50 times or less, even more preferably 10 times or less, particularly preferably 5 times or less, the central wavelength $\lambda c$.

The diameter or groove width of each concave portion 15 is preferably 0.005 times to 25 times, more preferably 0.025 times to 10 times, even more preferably 0.05 times to 2.5 times, particularly preferably 0.25 times to 2 times, the central wavelength $\lambda c$.

The diameter or groove width herein mentioned is the diameter or width of each concave portion 15 measured at the midpoint of the depth of the concave portion 15, in other words the half-value width.

The diameter or groove width of each concave portion 15 may be suitably set in the above-mentioned range; it is preferable to set the diameter or groove width according to the pitch P such that the refractive index gradually decreases in a macroscopic manner in proportion to the distance from the surface. Specifically, when the pitch P is large, it is preferable to make the diameter or groove width of the concave portion 15 large as well; whereas when the pitch P is small, it is preferable to make the diameter or groove width of the concave portion 15 small as well. From the foregoing viewpoint, it is desirable that the diameter or groove width be approximately half the pitch P, preferably 20% to 80%, more preferably 30% to 70%, even more preferably 40% to 60%, of the pitch P.

The depth of each concave portion 15 is preferably 0.01 times to 20 times, more preferably 0.05 times to 10 times, even more preferably 0.1 times to 5 times, particularly preferably 0.2 times to 2 times, the central wavelength $\lambda c$.

—Concavo-Convex Pattern Forming Method (Imprinting Method) According to (2)—

As the imprinting method, a thermal nanoimprinting method or optical nanoimprinting method may be employed.

In the nanoimprinting method, a plurality of convex portions of an imprint mold are pressed against an imprint layer formed on the surface of a base material. Here, the temperature of the system is kept in the vicinity of the glass transition temperature (Tg) of the imprint layer, and the temperature of the imprint layer becomes lower than the glass transition temperature of a thermoplastic resin contained in the imprint layer after the transfer of the pattern, thereby curing the thermoplastic resin. When the imprint mold is separated from the imprint layer, a concavo-convex pattern is formed at the imprint layer.

In the optical nanoimprinting method, a resist concavo-convex pattern is formed using an imprint mold which transmits light and which is made of a material (for example, quartz ($SiO_2$), an organic resin (PET, PEN, polycarbonate, low-melting-point fluorine resin, etc.) or the like) having such strength as can function as an imprint mold.

Subsequently, an imprint layer formed of an imprint composition containing at least a photocurable resin is irradiated with an ultraviolet ray or the like so as to harden the pattern transferred thereto. Here, note that the pattern may be hardened by ultraviolet irradiation after the mold is separated from a base material with the imprint layer, which follows the patterning.

An imprint mold with its pattern formed by etching, using as a mask an organic layer provided with a concavo-convex pattern by applying condensed light to the organic layer whose shape can change in heat mode, is preferable as the above-mentioned imprint mold.

Figure 3A:
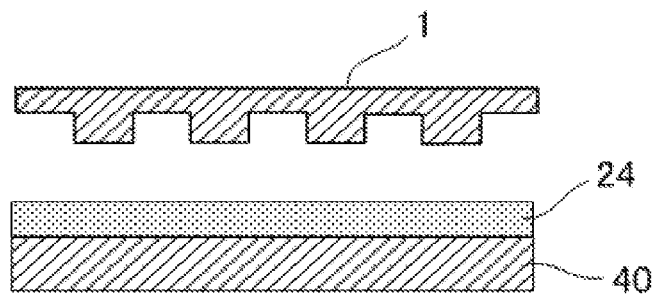
FIG. 3A is a drawing showing a step of forming a concavo-convex pattern by imprinting.
Figure 3B:
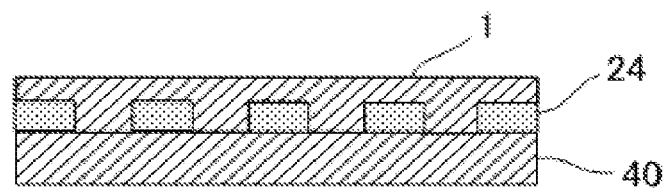
FIG. 3B is a drawing showing a step of forming the concavo-convex pattern by imprinting.
Figure 3C:
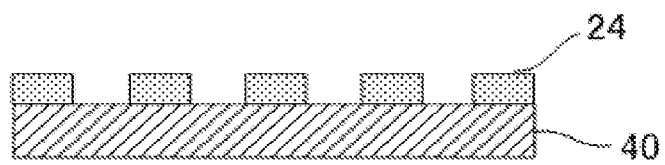
FIG. 3C is a drawing showing a step of forming the concavo-convex pattern by imprinting.

FIGS. 3A to 3C are process drawings together showing a method of forming a concavo-convex pattern by imprinting.

As shown in FIG. 3A, an imprint mold 1 with a concavo-convex pattern formed on its surface is pressed against an imprint layer 24 formed on a base material 40, which is made of aluminum, glass, silicon or quartz, by applying an imprint resist solution containing polymethyl methacrylate (PMMA) or the like onto the base material 40.

Next, as shown in FIG. 3B, when the imprint mold 1 is being pressed against the imprint layer 24, the temperature of the system is kept in the vicinity of the glass transition temperature (Tg) of the imprint resist solution, and the temperature of the imprint layer 24 becomes lower than the glass transition temperature of the imprint resist solution after the transfer of the pattern, thereby curing the imprint resist solution. If necessary, the imprint resist solution may be cured by heating or UV irradiation. Thus, the concavo-convex pattern formed on the imprint mold 1 is transferred to the imprint layer 24.

Subsequently, as shown in FIG. 3C, when the imprint mold 1 is separated from the imprint layer 24, a concavo-convex pattern is formed at the imprint layer 24.

<Fine Particle Forming Step>

The fine particle forming step is a step of forming fine particles made of a fine particle material on at least part of the concavo-convex pattern formed on the surface of the base material by the concavo-convex pattern forming step.

It is preferable to form fine particles on part of the concavo-convex pattern. The method for forming the fine particles is not particularly limited as long as it is a method in which the deposition rate varies depending upon the place on the concavo-convex pattern. For instance, by vapor-depositing fine particles over the concavo-convex pattern from an oblique direction, the fine particles can be deposited only on places of concave portions, that face a vapor deposition source.

The fine particle forming method is not particularly limited as long as fine particles can be formed on part of the concavo-convex pattern in a selective manner, and the fine particle forming method may be suitably selected according to the purpose. Examples thereof include vacuum vapor deposition, sputtering, CVD, plating, precipitation in solution, and spraying. Among these, vacuum vapor deposition, low-pressure sputtering and spraying are preferable, and vacuum vapor deposition is particularly preferable.

Examples of the vacuum vapor deposition include electron beam vapor deposition and ion plating.

Regarding the sputtering: (1) in the case of low-pressure deposition, a reduction in the pressure at the time of deposition is preferable because the distribution of the moving direction of fine particles arriving at a deposition surface narrows, and thus there is an increase in anisotropy. The pressure of the deposition surface is preferably 0.1 Pa or less, more preferably 0.01 Pa or less, even more preferably 0.001 Pa or less. The low-pressure deposition can be realized by decreasing the pressure of a deposition surface area only or by a method such as ion beam sputtering.

(2) In the case of high-pressure deposition, preferred methods include a method of increasing the pressure at the time of deposition and selectively depositing fine particles on convex portions. The pressure of the deposition surface is preferably 0.5 Pa or greater, more preferably 5 Pa or greater.

—Vacuum Vapor Deposition—

Figure 1A:
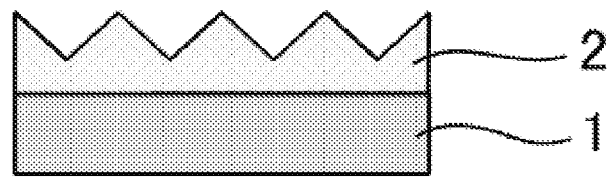
FIG. 1A is a schematic drawing showing a concavo-convex pattern forming step in a method of the present invention for producing fine particles.
Figure 1B:
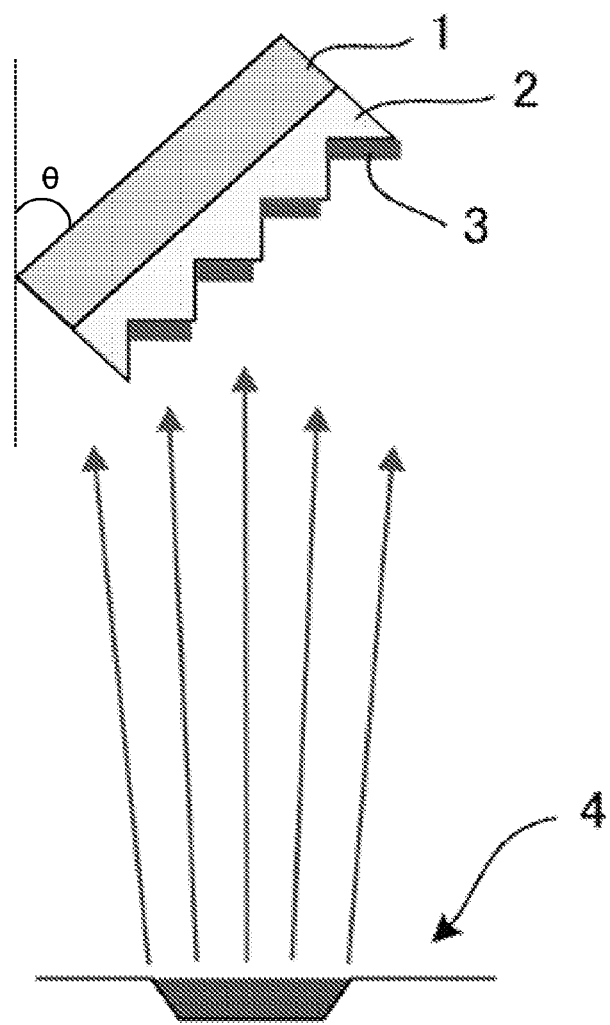
FIG. 1B is a schematic drawing showing a fine particle forming step in the method of the present invention for producing fine particles.

The vacuum vapor deposition is preferably performed at an angle θ of 1° to 80° to the direction perpendicular to the base material, with the concavo-convex pattern side of the base material facing a direction of the vacuum vapor deposition (see FIG. 1B).

The lower limit value of the angle at which the vacuum vapor deposition is performed is preferably 1° or greater, more preferably 5° or greater, even more preferably 10° or greater. The upper limit value of the angle is preferably 80° or smaller, more preferably 70° or smaller, even more preferably 60° or smaller, particularly preferably 50° or smaller. When the angle is too small, there may be a decrease in vapor deposition efficiency. When the angle is too large, fine particles may join together.

It should be noted that in the case where the depth of concave portions is greater than the vacuum vapor deposition thickness and slopes of the concave portions are steep, the angle may be 90° (it is possible to decide not to form an angle).

The upper limit value of the pressure at the time of the vacuum vapor deposition is preferably $1\times10^{-3}$ Torr, more preferably $5\times10^{-4}$ Torr, even more preferably $1\times10^{-4}$ Torr. The lower limit value thereof is preferably $1\times10^{-8}$ Torr, more preferably $5\times10^{-7}$ Torr, even more preferably $1\times10^{-6}$ Torr. The upper limit value of the vapor deposition rate is preferably 100 nm/s, more preferably 20 nm/s, even more preferably 5 nm/s. The lower limit value thereof is preferably 0.001 nm/s, more preferably 0.01 nm/s, even more preferably 0.1 nm/s.

At last two fine particle materials may be used in the vacuum vapor deposition so as to form fine particles with a laminated structure.

Also, at least two fine particle materials with different mixture proportions may be used in the vacuum vapor deposition so as to form fine particles composed of different components with respect to a thickness direction.

The fine particle material(s) is/are not particularly limited as long as it/they can be vapor-deposited, and it/they may be suitably selected according to the purpose. Suitable examples thereof include metals such as Ni, Cu, Al, Mo, Co, Cr, Ta, Pd, Pt and Au, and alloys thereof.

<Fine Particle Releasing Step>

The fine particle releasing step is a step of releasing the formed fine particles from the concavo-convex pattern.

The fine particles formed on the part of the concavo-convex pattern can be released as fine particles by removing the concavo-convex pattern situated under the fine particles.

Examples of the method of releasing the fine particles include removal of the concavo-convex pattern where the fine particles are formed, separation of the fine particles from the concavo-convex pattern, physical separation of the particles, and removal of the concavo-convex pattern by dry etching. Among these, removal of the concavo-convex pattern with solvent is particularly preferable.

As to the removal of the concavo-convex pattern with solvent, the concavo-convex pattern is made soluble in a solvent, the fine particles are made insoluble in the solvent, and the concavo-convex pattern and the fine particles are immersed in the solvent, thereby making it possible to release the fine particles. Note that when the fine particles are released using a solvent, a dispersant may be added to avoid cohesion.

In this releasing method, the fine particles can be released by immersing the base material in a solvent bath, then agitating the liquid, applying an ultrasonic wave or increasing the temperature. Among these, application of an ultrasonic wave is particularly preferable.

As to the physical separation of the particles, the particles are swept off using a brush or the like. In this case, part of the concavo-convex pattern is swept off as well; nevertheless, this is a simple process.

As to the removal of the concavo-convex pattern by dry etching, the resistance of the concavo-convex pattern to dry etching is decreased, the resistance of the fine particles to dry etching is increased, and then dry etching is carried out.

Parenthetically, in the fine particle forming step, there is a case where fine particles are slightly joined to one another. To separate these particles from one another, it is preferable to etch the fine particle film uniformly and slightly by dry etching or the like.

Here, an example of the method of the present invention for producing fine particles is explained with reference to FIGS. 1A to 1C.

FIG. 1A is a drawing showing a concavo-convex pattern forming step for forming on a surface of a base material 1 a concavo-convex pattern made by arranging a plurality of convex portions on the surface. The method of forming the concavo-convex pattern is not particularly limited and may be suitably selected according to the purpose. Examples thereof include nanoimprinting and a method of forming a concavo-convex pattern by applying condensed light to an organic layer whose shape can change in heat mode.

FIG. 1B is a drawing showing a fine particle forming step for forming fine particles 3 made of a fine particle material on at least part of the concavo-convex pattern. By subjecting fine particles to vacuum vapor deposition at an angle θ of 1° to 80° to the direction perpendicular to the base material, with the concavo-convex pattern side of the base material facing a vacuum vapor deposition device 4, the fine particles can be formed on part of the concavo-convex pattern.

Figure 1C:
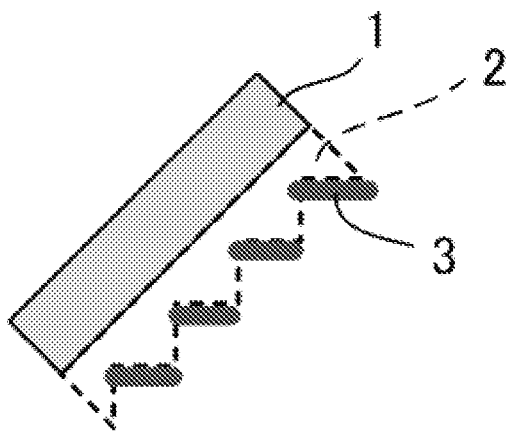
FIG. 1C is a schematic drawing showing a fine particle releasing step in the method of the present invention for producing fine particles.

FIG. 1C is a drawing showing a fine particle releasing step for releasing the formed fine particles 3 from the concavo-convex pattern. By immersing in a solvent the base material 1 with the concavo-convex pattern on which the fine particles are formed, an organic layer 2 having the concavo-convex pattern dissolves, and thus the fine particle can be released.

The lower limit value of the size of the fine particles produced by the method of the present invention for producing fine particles is preferably 0.1 nm or greater each, more preferably 1 nm or greater each, even more preferably 5 nm or greater each, particularly preferably 10 nm or greater each. When the size of the fine particles is too small, they cohere and thus do not easily exhibit properties as fine particles.

The upper limit value of the size of the fine particles is preferably 100 μm or less each, more preferably 50 μm or less each, even more preferably 10 μm or less each, particularly preferably 5 μm or less each. When the size of the fine particles is too large, the deposition amount needs to be large when they are vapor-deposited, and they may join together owing to their movement.

The size distribution of the fine particles can be controlled at the time of laser processing.

The shape of the fine particles is not particularly limited and may be suitably selected according to the purpose. Examples thereof include an elliptical disc shape, a rugby ball shape, an arc-like shape and a triangular prism. The shape of the fine particles can be confirmed using a scanning electron microscope (SEM). Parenthetically, in a conventional method for forming fine particles such as liquid-phase or gas-phase formation of fine particles, there is no restriction around the fine particles, so that they are generally axially symmetric, for example in the form of needles, and are, in many cases, uniaxial rotation symmetric objects. According to the method of the present invention, fine particles are formed whose shape is restricted by the shape of minute holes. These fine particles are characterized by having a complicated shape in a three-dimensional manner. The difference between the shapes can be confirmed by observation using an SEM. In the present invention, due to such a complicated shape, there is a great possibility that various properties will be able to be obtained.

—Uses—

Regarding the fine particles of the present invention, it is possible to produce particles whose dimensions can be freely adjusted, particles with high homogeneity, fine particles composed of different components, and fine particles with a laminated structure. The fine particles have a variety of uses; for example, in the case of those of nanometer size, they exhibit specific properties in terms of optical properties, electrical and/or magnetic properties, thermal properties and mechanical properties, and can be used in light emitting devices, displays, recording materials, engineering plastics, cellular phones, magnetic disks and so forth.

Also, the fine particles can be used as high-refractive-index dispersed materials, scattered fine particles for capturing light of light emitting devices, high-density magnetic materials, materials in cosmetics, materials in drugs delivered and so forth.

Furthermore, shape-anisotropic fine particles are useful in enhancing functions. For example, their shape anisotropy makes it possible to increase magnetic anisotropy further and enhance magnetic stability. Since these particles can also exhibit optical anisotropy, they can be suitably used as polarizer materials, birefringent materials and the like.

For instance, in the case where disc-shaped fine particles with a high refractive index are dispersed in a binder with a low refractive index and applied, being disposed in a thin film of the binder such that the central axes of the discs are perpendicularly positioned, it is possible to produce birefringence depending upon the incident angle of light to the thin film. Meanwhile, in the case where needle-like metal particles are dispersed in a binder so as to form a film, being disposed such that their major axes face a specific direction in the surface, it is possible to control the transmittance depending upon the polarization direction to the film.

EXAMPLES

The following explains Examples of the present invention. It should, however, be noted that the present invention is not confined to these Examples in any way.

Example 1

A solution prepared by dissolving 15 mg of the oxonol organic substance represented by the following structural formula in 1 ml of 2,2,3,3-tetrafluoro-1-propanol was applied onto a 50 mm×50 mm×0.5 mm glass substrate using a spin coater at a rotational speed of 300 rpm and then dried at a rotational speed of 1,000 rpm so as to form an organic layer having a thickness of 70 nm.

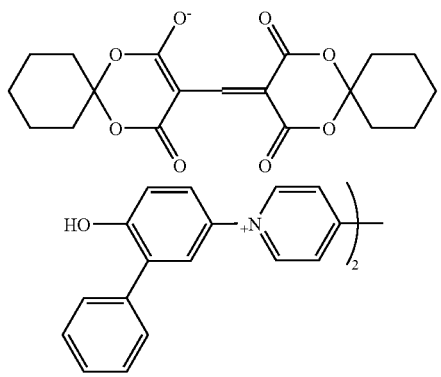

Figure 4A:
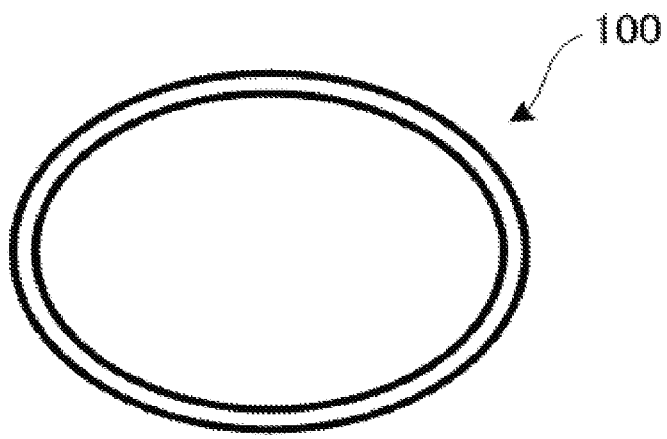
FIG. 4A is a schematic drawing showing a concave portion formed in an organic layer in Example 1.

Next, the organic layer on the substrate was subjected to laser irradiation, using NEO 1000 (manufactured by Pulstec Industrial Co., Ltd.), at a pitch of 0.5 μm with respect to both the circumferential direction and the radius direction and at 5 m/s and 8 mW. Thus, the substrate with a concavo-convex pattern formed on its surface was obtained. A schematic drawing of a concave portion 100 formed in the organic layer is shown in FIG. 4A.

Figure 4B:
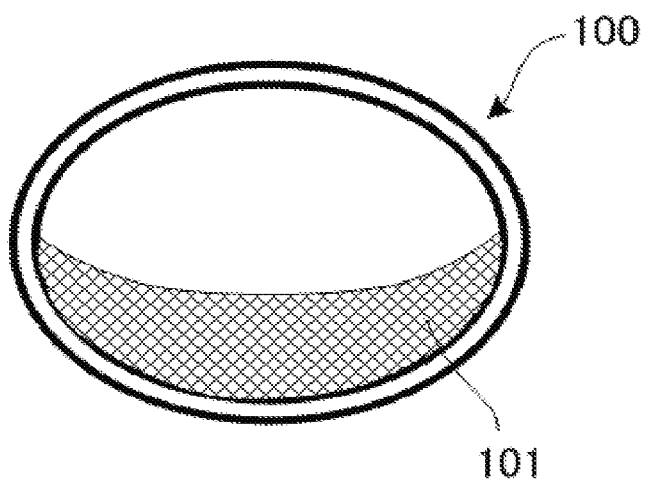
FIG. 4B is a schematic drawing showing a state in which aluminum fine particles are formed on part of the concave portion shown in FIG. 4A.

Subsequently, vacuum vapor deposition using aluminum as a fine particle material was performed at an angle of 30° to the direction perpendicular to the substrate, with the concavo-convex pattern side of the substrate facing a direction of the vacuum vapor deposition, such that a layer of the aluminum having a thickness of 30 nm was deposited on part of the concavo-convex pattern. Thus, as shown in FIG. 4B, aluminum fine particles 101 were formed on part of the concave portion 100.

Thereafter, the substrate with the concavo-convex pattern formed on its surface was immersed in 2,2,3,3-tetrafluoro-1-propanol to dissolve the concavo-convex pattern, and aluminum fine particles were thus obtained in the solution.

When the obtained aluminum fine particles were observed using a scanning electron microscope (SEM), it was found that they were elliptical disc-shaped fine particles each having a long-side length of approximately 200 nm, a short-side length of approximately 100 nm and a thickness of approximately 30 nm. The dimensional variation of the long-side length was 10% as a standard deviation.

When the elliptical disc-shaped fine particles with a high refractive index, produced in Example 1, were dispersed in a binder with a low refractive index and applied so as to produce a thin film in which the central axes of the discs were perpendicularly positioned, it was possible to produce birefringence depending upon the incident angle of light to the thin film.

Example 2

An organic layer was formed in the same manner as in Example 1, except that the oxonol organic substance represented by the following structural formula was used instead of the oxonol organic substance represented by the above structural formula.

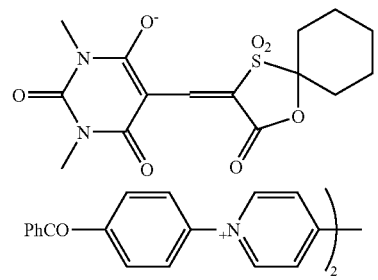

Figure 5A:
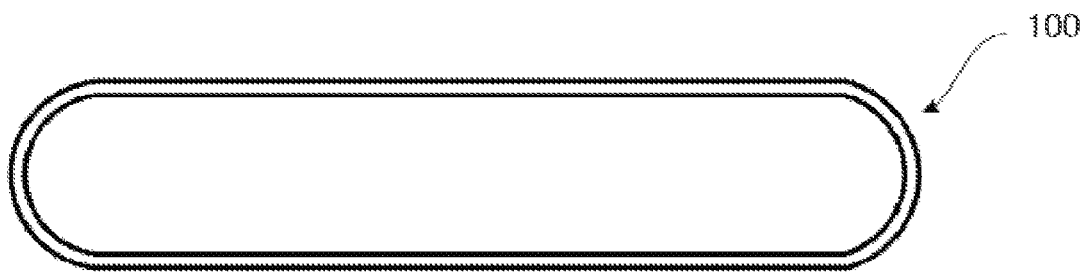
FIG. 5A is a schematic drawing showing a concave portion formed in an organic layer in Example 2.

Next, the organic layer on the substrate was subjected to laser irradiation, using NEO 1000 (manufactured by Pulstec Industrial Co., Ltd.), at a pitch of 0.5 μm with respect to the radius direction and a pitch of 1.0 μm with respect to the circumferential direction and at 5 m/s and 8 mW. Thus, the substrate with a concavo-convex pattern formed on its surface was obtained. A schematic drawing of a concave portion 100 formed in the organic layer is shown in FIG. 5A.

Figure 5B:
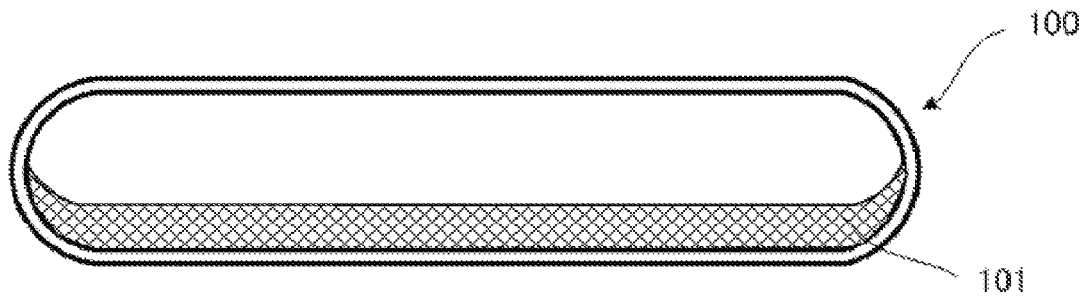
FIG. 5B is a schematic drawing showing a state in which silver fine particles are formed on part of the concave portion shown in FIG. 5A.

Subsequently, vacuum vapor deposition using silver as a fine particle material was performed at an angle of 30° to the direction perpendicular to the substrate, with the concavo-convex pattern side of the substrate facing a direction of the vacuum vapor deposition, such that a layer of the silver having a thickness of 40 nm was deposited on part of the concavo-convex pattern. Thus, as shown in FIG. 5B, silver fine particles 101 were formed on part of the concave portion 100.

Thereafter, the substrate with the concavo-convex pattern formed on its surface was immersed in 2,2,3,3-tetrafluoro-1-propanol to dissolve the concavo-convex pattern, and silver fine particles were thus obtained in the solution.

When the obtained silver fine particles were observed using a scanning electron microscope (SEM), it was found that they were elliptical disc-shaped fine particles each having a long-side length of approximately 500 nm, a short-side length of approximately 100 nm and a thickness of approximately 40 nm.

Example 3

Layer formation was carried out in the same manner as in Example 1, except that a layer of aluminum was deposited so as to have a thickness of 15 nm and then a layer of gold was deposited thereon so as to have a thickness of 15 nm at the time of vacuum vapor deposition.

Thus, elliptical disc-shaped fine particles having a two-layer structure composed of aluminum and gold were obtained.

Example 4

An organic layer was formed in the same manner as in Example 1, except that the phthalocyanine organic substance

[(ZnPc(α-SO$_2$Bu-sec)$_4$] was used instead of the oxonol organic substance represented by the above structural formula; vacuum vapor deposition using aluminum as a fine particle material was performed; a substrate with a concavo-convex pattern formed on its surface was immersed in acetone to dissolve the concavo-convex pattern; and aluminum fine particles were thus obtained in the solution.

When the obtained aluminum fine particles were observed using a scanning electron microscope (SEM), it was found that they were elliptical disc-shaped fine particles having a size similar to that of the fine particles in Example 1.

Example 5

An organic layer was formed in the same manner as in Example 1, except that the azo organic substance represented by the following structural formula was used instead of the oxonol organic substance represented by the above structural formula.

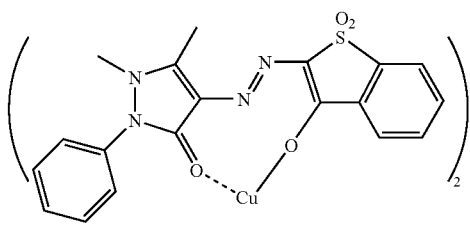

Next, the organic layer on the substrate was subjected to laser irradiation, using NEO 1000 (manufactured by Pulstec Industrial Co., Ltd.), at a pitch of 1 μm with respect to the radius direction and a pitch of 2 μm with respect to the circumferential direction and at 5 m/s and 8 mW. Thus, the substrate with a concavo-convex pattern formed on its surface was obtained.

Next, vacuum vapor deposition using aluminum as a fine particle material was performed at an angle of 30° to the direction perpendicular to the substrate, with the concavo-convex pattern side of the substrate facing a direction of the vacuum vapor deposition, such that a layer of the aluminum having a thickness of 100 nm was deposited on part of the concavo-convex pattern.

Thereafter, the substrate with the concavo-convex pattern formed on its surface was immersed in 2,2,3,3-tetrafluoro-1-propanol to dissolve the concavo-convex pattern, and aluminum fine particles were thus obtained in the solution.

When the obtained aluminum fine particles were observed using a scanning electron microscope (SEM), it was found that they were elliptical disc-shaped fine particles each having a long-side length of 1 μm, a short-side length of 0.5 μm and a thickness of 0.1 μm.

Example 6

—Nanoimprinting Method—

A substrate with a concavo-convex pattern formed on its surface was obtained in the same manner as in Example 1, except that a silicon substrate was used instead of the glass substrate.

Thereafter, the silicon substrate was dry-etched using as a mask the organic layer at which the concavo-convex pattern was formed, and concave portions having a depth of 100 nm were formed in the silicon substrate. As to conditions for the dry etching, reactive ion etching (RIE) was carried out at an output of 150 W with SF$_6$ as a gas. An imprint mold was thus produced.

Subsequently, SD640 (manufactured by Dainippon Ink And Chemicals, Incorporated) was applied onto a glass substrate and UV-cured so as to form an imprint layer having a thickness of 10 μm.

The produced imprint mold was pressed against the imprint layer on the glass substrate so as to transfer the concavo-convex pattern of the imprint mold to the imprint layer, and the imprint mold was separated from the imprint layer so as to form a concavo-convex pattern over the glass substrate (nanoimprinting method).

The same oxonol organic substance as the one in Example 1 was applied by spin coating onto the concavo-convex pattern formed over the glass substrate, such that the oxonol organic substance became a layer having a thickness of 150 nm.

Next, vacuum vapor deposition using aluminum as a fine particle material was performed at an angle of 30° to the direction perpendicular to the glass substrate, with the concavo-convex pattern side of the substrate facing a direction of the vacuum vapor deposition, such that a layer of the aluminum having a thickness of 100 nm was deposited on part of the concavo-convex pattern.

Thereafter, the glass substrate with the concavo-convex pattern formed on its surface was immersed in 2,2,3,3-tetrafluoro-1-propanol to dissolve the concavo-convex pattern, and aluminum fine particles were thus obtained in the solution.

When the obtained aluminum fine particles were observed using a scanning electron microscope (SEM), it was found that they were elliptical disc-shaped fine particles each having a long-side length of approximately 200 nm, a short-side length of approximately 100 nm and a thickness of approximately 20 nm. The dimensional variation of the long-side length was at much the same level as in Example 1.

Reference Example 1

Aluminum fine particles were formed in the same manner as in Example 1, except that the vacuum vapor deposition was performed at an angle of 90°. Consequently, some fine particles joined together.

Reference Example 2

Fine particles were produced by thermal processing as in an Example of JP-A No. 06-28933. Consequently, since these particles were rounded by a thermal flow, particles of material from a plurality of concave and convex portions came together, and thus the particles became two or more times larger in size.

Regarding fine particles obtained by the method of the present invention for producing fine particles, it is possible to produce particles whose dimensions can be freely adjusted, particles with high homogeneity, fine particles composed of different components, and fine particles with a laminated structure. These can be widely used in a variety of fields, notably as polarizer materials, birefringent materials and the like.

What is claimed is:
1. A method for producing fine particles, comprising:
forming on a surface of a base material a concavo-convex pattern made by arranging a plurality of convex portions on the surface;

forming fine particles made of a fine particle material on a part of the concavo-convex pattern; and releasing the formed fine particles from the concavo-convex pattern, wherein the fine particles are released by removal of the concavo-convex pattern where the fine particles are formed, and the removal is performed by dissolving the concavo-convex pattern in a solvent.

2. The method according to claim 1, wherein in the forming the concavo-convex pattern, an organic layer whose shape can change in heat mode is provided on the surface of the base material, and condensed light is applied to the organic layer so as to form the concavo-convex pattern.

3. The method according to claim 1, wherein in the forming the concavo-convex pattern, the concavo-convex pattern is formed by an imprinting method in which an imprint layer is provided on the surface of the base material, and an imprint mold is pressed against the imprint layer.

4. The method according to claim 3, wherein the imprint mold is formed by etching, using as a mask an organic layer provided with a concavo-convex pattern by applying condensed light to the organic layer whose shape can change in heat mode.

5. The method according to claim 1, wherein the fine particles are formed by vacuum vapor deposition, and the vacuum vapor deposition is performed at an angle of 1° to 80° between the base material and a direction of a beam of the vapor deposition with the concavo-convex pattern side of the base material facing a direction of the vacuum vapor deposition.

6. The method according to claim 5, wherein at least two fine particle materials are used in the vacuum vapor deposition so as to form fine particles with a laminated structure.

7. The method according to claim 5, wherein at least two fine particle materials with different mixture proportions are used in the vacuum vapor deposition so as to form fine particles composed of different components with respect to a thickness direction.

* * * * *